(12) United States Patent
Heo

(10) Patent No.: US 10,692,858 B2
(45) Date of Patent: Jun. 23, 2020

(54) SEMICONDUCTOR DEVICES AND METHODS OF FABRICATING THE SAME

(71) Applicant: Samsung Electronics Co., Ltd., Suwon-si, Gyeonggi-do (KR)

(72) Inventor: YeonCheol Heo, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/393,504

(22) Filed: Apr. 24, 2019

(65) Prior Publication Data

US 2019/0252371 A1 Aug. 15, 2019

Related U.S. Application Data

(63) Continuation of application No. 15/627,768, filed on Jun. 20, 2017, now Pat. No. 10,319,715.

(30) Foreign Application Priority Data

Dec. 9, 2016 (KR) .......................... 10-2016-0167850

(51) Int. Cl.
| | |
|---|---|
| *H01L 27/06* | (2006.01) |
| *H01L 21/8234* | (2006.01) |
| *H01L 21/8249* | (2006.01) |
| *H01L 29/06* | (2006.01) |
| *H01L 27/12* | (2006.01) |

(Continued)

(52) U.S. Cl.
CPC ...... *H01L 27/0623* (2013.01); *H01L 21/8249* (2013.01); *H01L 21/823487* (2013.01); *H01L 27/1203* (2013.01); *H01L 29/0649* (2013.01); *H01L 29/0804* (2013.01); *H01L 29/1004* (2013.01); *H01L 29/42392* (2013.01); *H01L 29/66272* (2013.01); *H01L 29/732* (2013.01); *H01L 29/7371* (2013.01); *H01L 29/78642* (2013.01)

(58) Field of Classification Search
CPC ......... H01L 21/823487; H01L 21/8248; H01L 21/8249; H01L 27/0623
USPC ......... 257/350, 370; 438/314, 318, 324, 326
See application file for complete search history.

(56) References Cited

U.S. PATENT DOCUMENTS

| | | | |
|---|---|---|---|
| 6,759,730 B2 * | 7/2004 | Chaudhry | ......... H01L 21/82285 257/330 |
| 7,781,295 B1 | 8/2010 | Ramdani et al. | |

(Continued)

FOREIGN PATENT DOCUMENTS

JP  2006173258 A  6/2006

*Primary Examiner* — Matthew E Warren
(74) *Attorney, Agent, or Firm* — Harness, Dickey & Pierce, P.L.C.

(57) ABSTRACT

A semiconductor device may include a substrate, a first doped region and a second doped region on the substrate, a base region on the first doped region, a channel region on the second doped region, and a third doped region and a fourth doped region on the base region and the channel region, respectively. The first doped region and the second doped region may be isolated from direct contact with each other in a first direction that is substantially parallel to a top surface of the substrate. A channel gate structure may be on a side surface of the channel region. A thickness of the base region, in a second direction that is substantially perpendicular to the top surface of the substrate, may be equal to or larger than a thickness of the channel region.

15 Claims, 15 Drawing Sheets

(51) Int. Cl.
*H01L 29/66* (2006.01)
*H01L 29/732* (2006.01)
*H01L 29/08* (2006.01)
*H01L 29/10* (2006.01)
*H01L 29/786* (2006.01)
*H01L 29/423* (2006.01)
*H01L 29/737* (2006.01)

(56) References Cited

U.S. PATENT DOCUMENTS

| | | |
|---|---|---|
| 8,492,220 B2 | 7/2013 | Erickson et al. |
| 8,587,024 B2 | 11/2013 | Cheng |
| 8,629,029 B2 | 1/2014 | Chen et al. |
| 8,853,826 B2 | 10/2014 | Lai et al. |
| 9,117,845 B2 | 8/2015 | Nassar et al. |
| 9,230,968 B2 | 1/2016 | Guha et al. |
| 9,607,899 B1* | 3/2017 | Cheng ............ H01L 21/823475 |
| 2008/0001234 A1* | 1/2008 | Cheng ................ H01L 21/8249 |
| | | 257/370 |
| 2008/0106304 A1 | 5/2008 | Mun et al. |
| 2009/0309155 A1 | 12/2009 | Mkhitarian |
| 2011/0193174 A1* | 8/2011 | Yeh .................. H01L 21/28518 |
| | | 257/370 |
| 2014/0027817 A1* | 1/2014 | Trivedi ............... H01L 27/0623 |
| | | 257/192 |
| 2015/0097247 A1 | 4/2015 | Cai et al. |

* cited by examiner

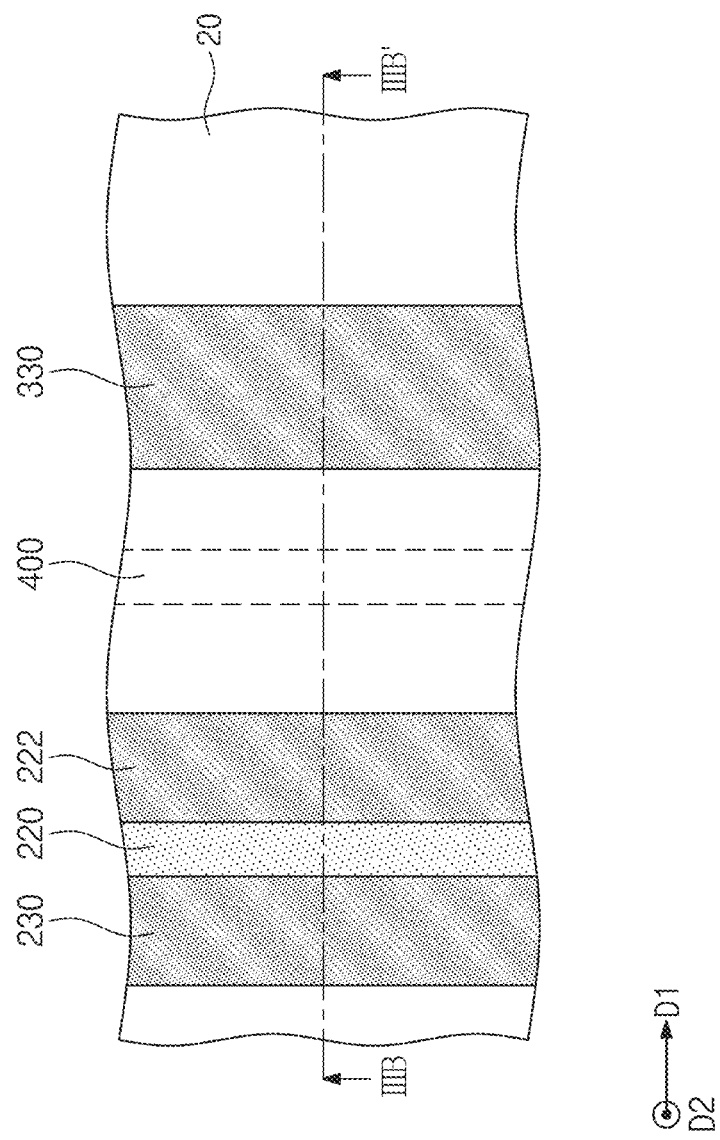

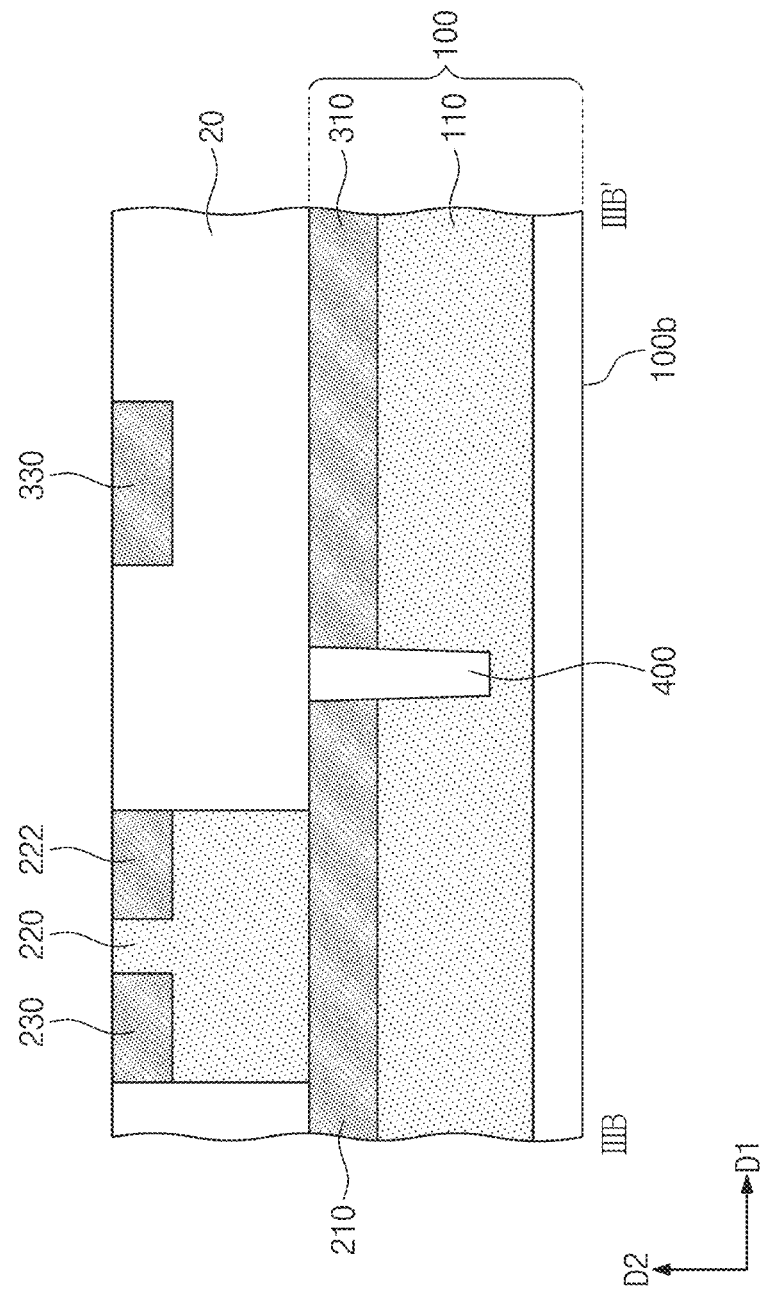

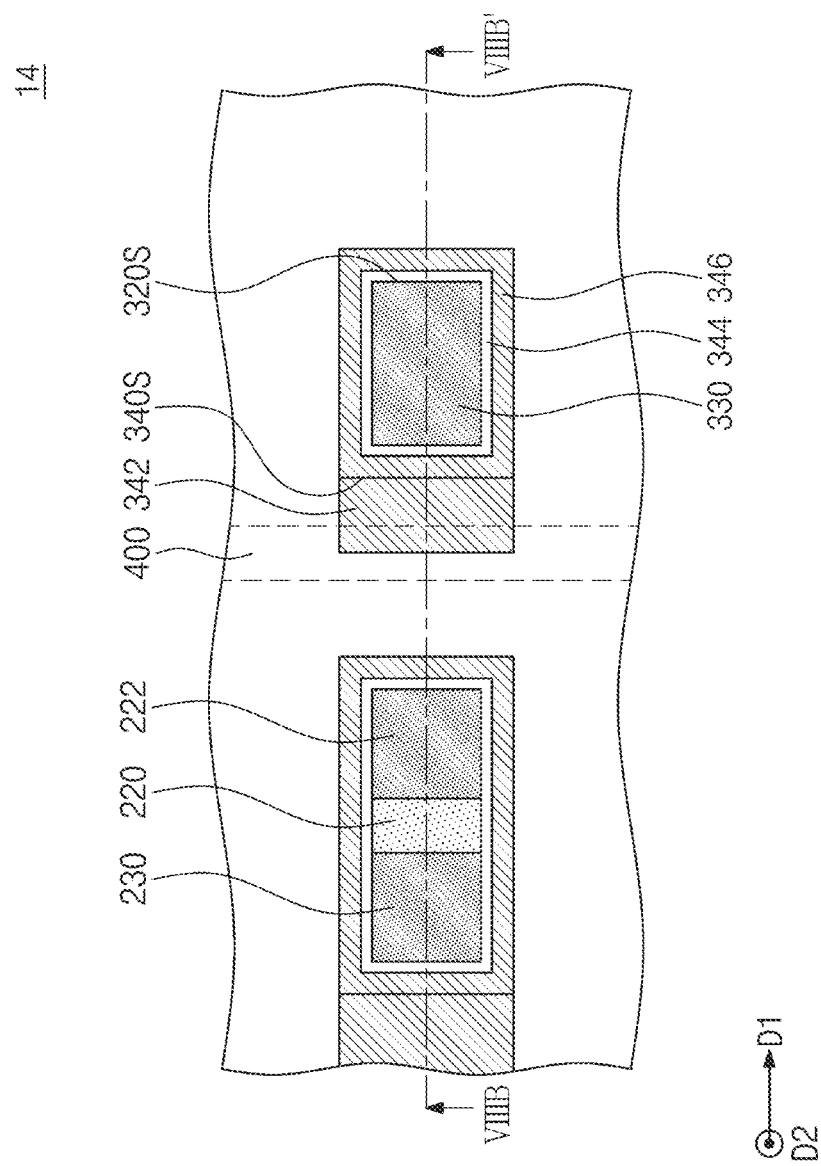

SEMICONDUCTOR DEVICES AND METHODS OF FABRICATING THE SAME

CROSS-REFERENCE TO RELATED APPLICATIONS

This is a continuation application of U.S. non-provisional patent application Ser. No. 15/627,768, filed on Jun. 20, 2017, which claims priority under 35 U.S.C. § 119 to Korean Patent Application No. 10-2016-0167850, filed on Dec. 9, 2016, in the Korean Intellectual Property Office, the entire contents of each of which are hereby incorporated by reference.

BACKGROUND

The present disclosure relates to semiconductor devices and methods of fabricating the same, and in particular, to methods of fabricating semiconductor devices with high production efficiency and semiconductor devices that may be fabricated according to one or more of the methods.

Due to their small-sized, multifunctional, and/or low-cost characteristics, semiconductor devices are considered to be important elements in the electronic industry. Semiconductor devices may be include various types of devices, including memory devices configured to store data, logic devices configured to process data, some combination thereof, or the like.

In addition, there is an ever-increasing demand for semiconductor devices that are associated with high operation speed and low operation voltage. To meet this demand, semiconductor devices that have an increased integration density may be produced. However, an increase in integration density of a semiconductor device may lead to deterioration in reliability of the semiconductor device. Thus, many studies are being conducted to realize a highly-integrated semiconductor device without the reliability deterioration.

SUMMARY

Some example embodiments of the inventive concepts provide a semiconductor device that is fabricated with high efficiency.

Some example embodiments of the inventive concepts provide a method capable of reducing cost associated with fabrication of a semiconductor device.

According to some example embodiments of the inventive concepts, a semiconductor device may include a substrate, a first doped region and a second doped region on the substrate, a base region on the first doped region, a channel region on the second doped region, a third doped region and a fourth doped region on the base region and the channel region, respectively, and a channel gate structure on a side surface of the channel region. The first doped region and the second doped region may be isolated from direct contact with each other in a first direction, the first direction substantially parallel to a top surface of the substrate. A thickness of the base region, in a second direction that is substantially perpendicular to the top surface of the substrate, may be equal to or larger than a thickness of the channel region.

According to some example embodiments of the inventive concepts, a method of fabricating a semiconductor device may include providing a substrate, the substrate including a device isolation layer, forming a first semiconductor pattern and a second semiconductor pattern on the substrate, and forming a channel gate structure on a side surface of the second semiconductor pattern. The first semiconductor pattern and the second semiconductor pattern may be isolated from direct contact with each other in a first direction that is substantially parallel to a top surface of the substrate. The device isolation layer may be between the first semiconductor pattern and the second semiconductor pattern in the first direction. Each given semiconductor pattern, of the first semiconductor pattern and the second semiconductor pattern, may include a lower doped region and an upper doped region in lower and upper portions of the given semiconductor pattern, respectively. The first semiconductor pattern may include a base region between the upper doped region and the lower doped region of the first semiconductor pattern. The base region may be associated with a first conductivity type. The upper doped region and the lower doped region of each given semiconductor pattern may be associated with a second conductivity type that is different from the first conductivity type.

According to some example embodiments of the inventive concepts, a semiconductor device may include a first doped region and a second doped region, the first doped region and the second doped region isolated from direct contact with each other in a first direction, a base region and a channel region on the first doped region and the second doped region, respectively, in a second direction, the second direction being substantially perpendicular to the first direction, and a third doped region and a fourth doped region on the base region and the channel region, respectively, in the second direction.

According to some example embodiments of the inventive concepts, a semiconductor device may include a substrate, the substrate including a device isolation layer, and a first semiconductor pattern and a second semiconductor pattern on the substrate. The first semiconductor pattern and the second semiconductor pattern may be isolated from direct contact with each other in a first direction, such that the device isolation layer is between the first semiconductor pattern and the second semiconductor pattern in the first direction. Each given semiconductor pattern, of the first semiconductor pattern and the second semiconductor pattern, may include a lower doped region and an upper doped region in lower and upper portions of the given semiconductor pattern, respectively. The first semiconductor pattern may include a base region between the upper doped region and the lower doped region of the first semiconductor pattern, the base region being associated with a first conductivity type. The upper doped region and the lower doped region of each given semiconductor pattern may be associated with a second conductivity type that is different from the first conductivity type.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIG. 2A, FIG. 3A, FIG. 4A, and FIG. 5A are plan views illustrating a method of fabricating a semiconductor device according to some example embodiments of the inventive concepts.

FIG. 2B, FIG. 3B, FIG. 4B, and FIG. 5B are cross-sectional views, which are respectively taken along lines IIB-IIB' of FIG. 2A, lines IIIB-IIIB' of FIG. 3A, lines IVB-IVB' of FIG. 4A, and lines VB-VB' of FIG. 5A, respectively.

FIG. 8A is a plan view of a semiconductor device according to some example embodiments of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given example embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown.

Figure 1A:
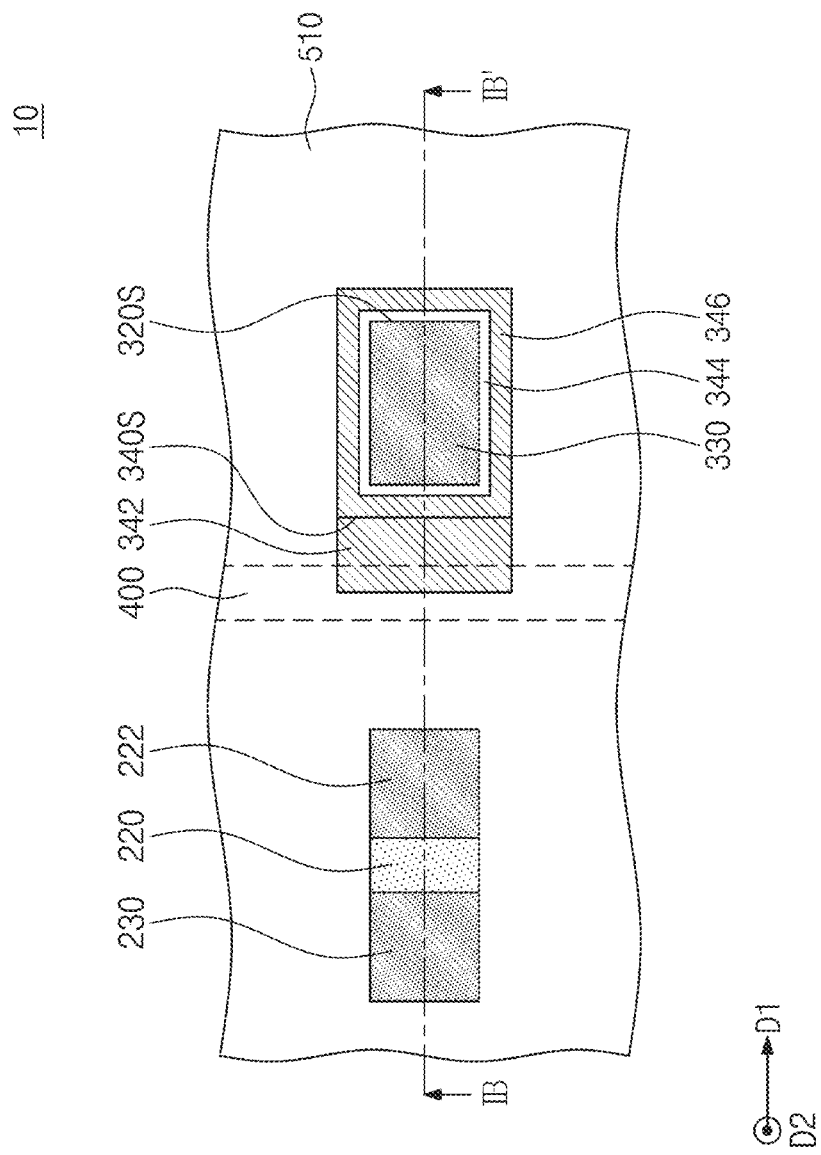
FIG. 1A is a plan view of a semiconductor device according to some example embodiments of the inventive concepts.
Figure 1B:
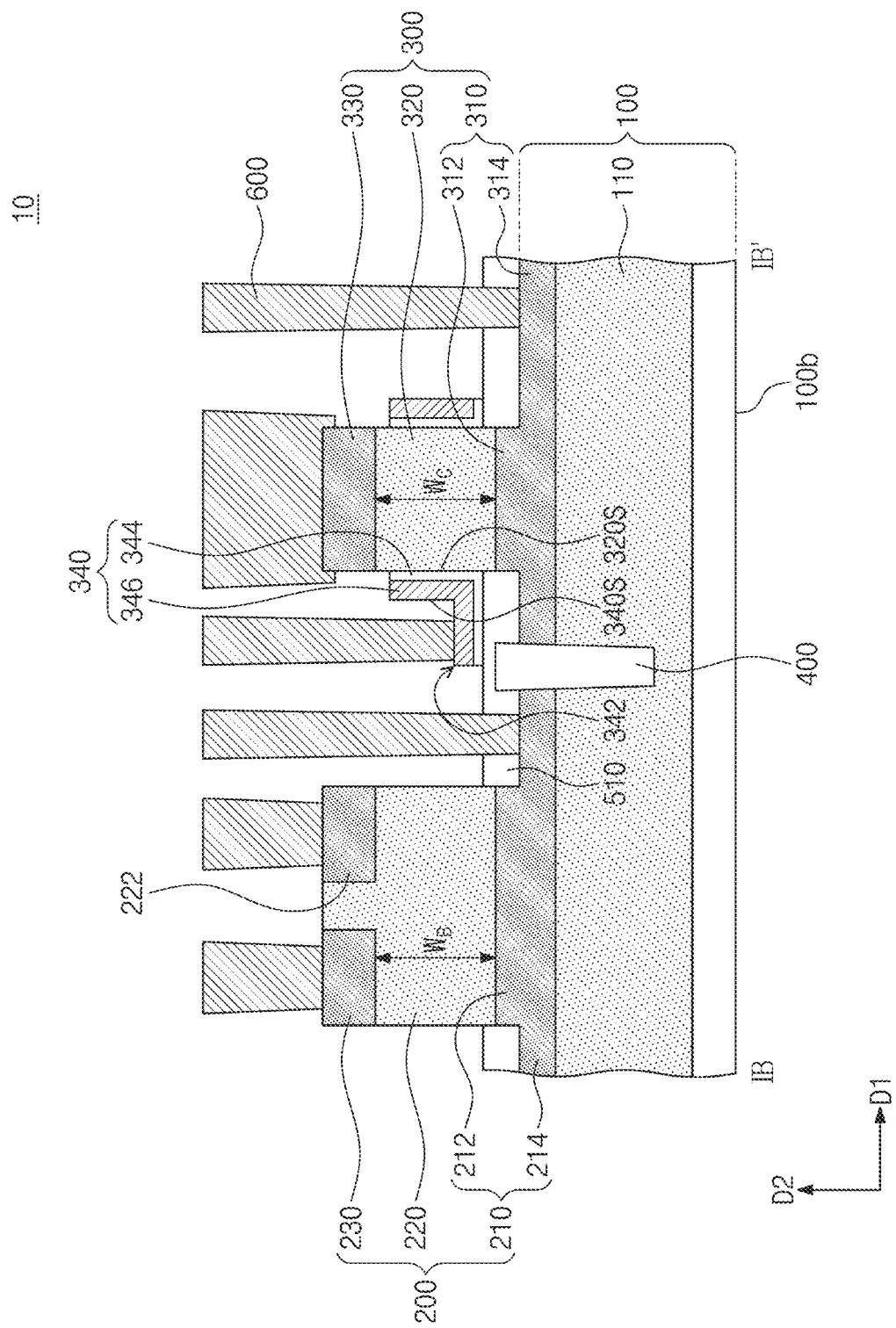
FIG. 1B is a cross-sectional view taken along line IB-IB' of FIG. 1A.

FIG. 1A is a plan view of a semiconductor device according to some example embodiments of the inventive concepts. FIG. 1B is a cross-sectional view taken along line IB-IB' of FIG. 1A. In order to reduce complexity in the drawings and to provide better understanding of example embodiments of the inventive concepts, contacts 600 are illustrated in only FIG. 1B.

Referring to FIGS. 1A and 1B, a semiconductor device 10 with a substrate 100 may be provided. For example, the substrate 100 may be a silicon wafer, a germanium wafer, a silicon-germanium wafer, a II-VI compound semiconductor wafer, or a III-V compound semiconductor wafer.

The substrate 100 may include an impurity well 110 (e.g., of a first conductivity type). The impurity well 110 may be formed by injecting impurities (not shown) into a region of a semiconductor substrate. The impurity well 110 may contain, for example, n-type impurities, but the inventive concepts are not limited thereto. For example, in some example embodiments, the first conductivity type may be a p-type. In some example embodiments, the first conductivity type may be one of the n- and p-types, even if there is no overlapping description thereof.

A first semiconductor pattern 200 and a second semiconductor pattern 300 may be provided on the impurity well 110 and may be separated from each other in a first direction D1 parallel or substantially parallel (e.g., parallel within manufacturing tolerances and/or material tolerances) to a bottom surface 100b of the substrate 100. Hereinafter, the first semiconductor pattern 200 and the second semiconductor pattern 300 may have thicknesses that are measured in a second direction D2 perpendicular or substantially perpendicular (e.g., perpendicular within manufacturing tolerances and/or material tolerances) to the bottom surface 100b of the substrate 100. The thicknesses of the first semiconductor pattern 200 and the second semiconductor pattern 300 may be substantially the same (e.g., may be the same within manufacturing tolerances and/or material tolerances). A height of a top surface of the first semiconductor pattern 200 may be substantially the same (e.g., may be the same within manufacturing tolerances and/or material tolerances) as that of a top surface of the second semiconductor pattern 300. In some example embodiments, the first semiconductor pattern 200 may be used to realize (and/or may at least partially comprise) a bipolar junction transistor (BJT), and the second semiconductor pattern 300 may be used as source, drain, and channel regions of (and/or may at least partially comprise) a metal-oxide-semiconductor field effect transistor (MOSFET). The BJT may be used to stably maintain a level of a voltage to be applied to the MOSFET and thereby to improve reliability of a semiconductor device. In some example embodiments, the MOSFET may be a vertical-type MOSFET with a vertical channel region. For example, in such a vertical-type MOSFET, the source and drain regions may be spaced apart from each other with the channel region interposed therebetween, in a direction perpendicular or substantially perpendicular (e.g., perpendicular within manufacturing tolerances and/or material tolerances) to the bottom surface 100b of the substrate 100. As referred to herein, elements that are "spaced apart from each other" may be referred to as being "isolated from direct contact with each other." For example, in FIG. 1B, the first doped region 210 and the second doped region 310 may be referred to interchangeably as being spaced apart from each other or as being isolated from direct contact with each other in the first direction D1.

The first semiconductor pattern 200 may include a first doped region 210, a base region 220 on the first doped region 210, and a third doped region 230 on the base region 220, and here, the first doped region 210 may have a second conductivity type that is different from the first conductivity type.

The first doped region 210 may be provided on the impurity well 110. For example, the first doped region 210 may be formed by injecting impurities of the second conductivity type into an upper portion of the impurity well 110. The second conductivity type may be, for example, a p-type, but the inventive concepts are not limited thereto. For example, in some example embodiments, the second conductivity type may be an n-type. In some example embodiments, the second conductivity type may be one of the n- and p-types, even if there is no overlapping description thereof. The first doped region 210 may include a center portion 212 and an edge portion 214, which extends laterally from a side surface of the center portion 212. When viewed in a plan view, the edge portion 214 of the first doped region 210 may be provided to surround the center portion 212. The first doped region 210 may have a thickness that is measured in the second direction D2. The center portion 212 of the first doped region 210 may have an upward protruding shape, relative to a top surface of the edge portion 214. A thickness of the center portion 212 of the first doped region 210 may be larger than a thickness of the edge portion 214. For example, the top surface of the center portion 212 of the first doped region 210 may be located at a level higher than that of a top surface of the edge portion 214. The first doped region 210 may be configured to serve as an emitter or collector region of the BJT.

The base region 220 may be provided on the center portion 212 of the first doped region 210. The base region 220 may be doped to have a first conductivity type (e.g., n-type). A base contact region 222 may be provided on the base region 220. The base contact region 222 may contain more impurities (e.g., of the first conductivity type or the n-type), compared with the base region 220. For example, concentration of impurities of the first conductivity type may be higher in the base contact region 222 than in the base region 220. The base region 220 and the base contact region 222 may have widths that are measured in the first direction D1. The width of the base contact region 222 may be less than that of the base region 220. The base region 220 and the base contact region 222 may serve as a base region of the BJT. During an operation of the BJT, by controlling a voltage to be applied to the base region 220, it may be possible to control an amount of electric current flowing between the collector and emitter regions of the BJT.

The third doped region 230 may be provided on the base region 220 to be spaced apart from the base contact region 222. The base contact region 222 may be spaced apart from the third doped region 230 in the first direction D1. The third doped region 230 and the base contact region 222 may be provided in such a way that a top surface of the base region 220 therebetween is exposed. The third doped region 230 may be doped to have the second conductivity type. For example, the third doped region 230 may be formed by injecting impurities of the second conductivity type into an upper portion of the base region 220. The second conductivity type may be, for example, a p-type. A thickness of the third doped region 230 may be a length of the third doped region 230 that is measured in the second direction D2. A thickness of the third doped region 230 may be less than that of the base region 220. The third doped region 230 may have a width that is measured in the first direction D1. For example, the width of the third doped region 230 may be less than that of the base region 220. The third doped region 230 may be in direct contact with the base region 220. The third doped region 230 may serve as the collector or emitter region of the BJT. If the first doped region 210 is used as the emitter region, the third doped region 230 may be used as the collector region. If the first doped region 210 is used as the collector region, the third doped region 230 may be used as the emitter region.

The second semiconductor pattern 300 may include a second doped region 310 of the second conductivity type, a channel region 320 on the second doped region 310, and a fourth doped region 330 on the channel region 320.

The second doped region 310 may be provided on the impurity well 110. For example, the second doped region 310 may be formed by injecting an upper portion of the impurity well 110 with impurities of the second conductivity type (e.g., p-type). The second doped region 310 may include a center portion 312 and an edge portion 314, which extends laterally from a side surface of the center portion 312. When viewed in a plan view, the edge portion 314 of the second doped region 310 may be provided to surround the center portion 312. The second doped region 310 may have a thickness that is measured in the second direction D2. The center portion 312 of the second doped region 310 may have an upward protruding shape, relative to a top surface of the edge portion 314. A thickness of the center portion 312 of the second doped region 310 may be larger than a thickness of the edge portion 314. In other words, a top surface of the center portion 312 of the second doped region 310 may be located at a level higher than that of a top surface of the edge portion 314. The second doped region 310 may be used as a source or drain region of the MOSFET.

The channel region 320 may be provided on the center portion 312 of the second doped region 310. The channel region 320 may be an intrinsic semiconductor region. In other words, the channel region 320 may not contain impurity. However, the inventive concepts are not limited to this example. In some example embodiments, the channel region 320 may be doped to have the first conductivity type (e.g., n-type). The channel region 320 may have a thickness that is measured in the second direction D2. In some example embodiments, the thickness of the channel region 320 may be substantially equal to (e.g., equal within manufacturing tolerances and/or material tolerances) or smaller than a thickness of the base region 220 between the first doped region 210 and the third doped region 230. In some example embodiments, a bottom surface of the channel region 320 may be located at a level that is equal to or higher than that of a bottom surface of the base region 220. The channel region 320 may serve as the channel region of the MOSFET. The channel region 320 may be used as a pathway for carrier transportation between the source and drain regions.

The fourth doped region 330 may cover a top surface of the channel region 320. For example, when viewed in a plan view, the fourth doped region 330 may be fully overlapped with the channel region 320. The fourth doped region 330 may have a thickness that is measured in the second direction D2. In some example embodiments, the thickness of the fourth doped region 330 may be substantially the same (e.g., may be the same within manufacturing tolerances and/or material tolerances) as that of the third doped region 230. As referred to herein, elements having thicknesses that are substantially the same may be referred to as having a substantially common magnitude of thickness. For example, the third doped region 230 and the fourth doped region 330 may be referred to as each having a substantially common magnitude of thickness in the second direction D2. A bottom surface of the fourth doped region 330 may be located at a level that is substantially equal (e.g., equal within manufacturing tolerances and/or material tolerances) to that of a bottom surface of the third doped region 230. The fourth doped region 330 may be doped to have the second conductivity type (e.g., p-type). In some example embodiments, concentration of impurities of the second conductivity type may be substantially the same (e.g., may be the same within manufacturing tolerances and/or material tolerances) in the fourth doped region 330 and the third doped region 230. The fourth doped region 330 may be used as the drain or source region of the MOSFET. In the case where the second doped region 310 is used as the source region of the MOSFET, the fourth doped region 330 may be used as the drain region. If the second doped region 310 is used as the drain region of the MOSFET, the fourth doped region 330 may be used as the source region.

A channel gate structure 340 may be provided on a side surface 320s of the channel region 320. The channel gate structure 340 may extend along the side surface 320s of the channel region 320 or may enclose the side surface 320s of the channel region 320. The channel gate structure 340 may be a ring-shaped structure extending along the side surface 320s of the channel region 320. The channel gate structure 340 may be overlapped with the channel region 320 in a horizontal direction. The channel gate structure 340 may have a thickness that is measured in the second direction D2.

The largest thickness of the channel gate structure 340 may be less than a thickness of the channel region 320. The channel gate structure 340 may be spaced apart from the second doped region 310 and the fourth doped region 330. The channel gate structure 340 may be spaced apart from the second doped region 310 and the fourth doped region 330 in the second direction D2. The channel gate structure 340 may not be overlapped with the second doped region 310 and the fourth doped region 330 in a horizontal direction. When viewed in a vertical section, the channel gate structure 340 may be located between a top surface of the second doped region 310 and a bottom surface of the fourth doped region 330. A bottom surface of the channel gate structure 340 may be located at a level higher than that of the top surface of the second doped region 310. A top surface of the channel gate structure 340 may be located at a level lower than that of the bottom surface of the fourth doped region 330. The channel gate structure 340 may include a pad portion 342 protruding laterally from a side surface 340s of the channel gate structure 340. The pad portion 342 may be used for electrical connection with a contact 600 to be described below. The channel gate structure 340 may serve as (e.g., may be configured to serve as) a gate electrode of the MOSFET.

The channel gate structure 340 may include a channel gate insulating layer 344 and a channel gate conductive layer 346 provided on the channel gate insulating layer 344. The channel gate insulating layer 344 may be provided between the channel gate conductive layer 346 and the channel region 320. In other words, the channel gate conductive layer 346 may be electrically disconnected from the channel region 320 by the channel gate insulating layer 344. The channel gate insulating layer 344 may be formed of or include a dielectric material. For example, the channel gate insulating layer 344 may be formed of or include at least one of high-k dielectric materials (e.g., aluminum oxide ($Al_2O_3$), hafnium oxide ($HfO_2$), zirconium oxide ($ZrO_2$), hafnium aluminum oxide (HfAlO), and hafnium silicon oxide (HfSiO)). The channel gate conductive layer 346 may be formed of or include a conductive material. For example, the channel gate conductive layer 346 may be formed of or include at least one of doped semiconductor materials (e.g., doped silicon), metals (e.g., tungsten (W), titanium (Ti), and tantalum (Ta)), conductive metal nitrides (e.g., titanium nitride, tantalum nitride, and tungsten nitride), metal-semiconductor compounds (e.g., metal silicide), or combination thereof.

A device isolation layer 400 may be provided between the first semiconductor pattern 200 and the second semiconductor pattern 300. When viewed in a plan view, the first semiconductor pattern 200 and the second semiconductor pattern 300 may be spaced apart from each other in the first direction D1 with the device isolation layer 400 interposed therebetween. The device isolation layer 400 may be provided on the substrate 100. The device isolation layer 400 may be inserted into a top surface of the substrate 100. The device isolation layer 400 may be provided to have a bottom surface that is located in the impurity well 110 of the substrate 100. A bottom surface of the device isolation layer 400 may be located at a level higher than that of a bottom surface of the impurity well 110 of the substrate 100. The device isolation layer 400 may be provided to have an upper portion protruding above the top surface of the substrate 100. A top surface of the device isolation layer 400 may be located at a level higher than that of the top surface of the substrate 100. The top surface of the device isolation layer 400 may be located at a level that is substantially equal to (e.g., equal within manufacturing tolerances and/or material tolerances) or higher than that of the top surface of the center portion 212 of the first doped region 210. The top surface of the device isolation layer 400 may be located at a level that is substantially equal to (e.g., equal within manufacturing tolerances and/or material tolerances) that of the top surface of the center portion 312 of the second doped region 310. The first doped region 210 and the second doped region 310 may be respectively provided on opposite side surfaces, which face each other in the first direction D1, of the device isolation layer 400. The device isolation layer 400 may be used to electrically separate the first doped region 210 and the second doped region 310 from each other. Accordingly, the first semiconductor pattern 200 and the second semiconductor pattern 300 may be electrically disconnected from each other.

A lower insulating layer 510 may be provided on the first doped region 210 and the second doped region 310 and the device isolation layer 400. The lower insulating layer 510 may cover the first doped region 210 and the second doped region 310 and the device isolation layer 400. The lower insulating layer 510 may be provided between the channel gate structure 340 and the second doped region 310. The lower insulating layer 510 may extend along the bottom surface of the channel gate structure 340 and may veil an interface between the second doped region 310 and the channel region 320 (e.g., cover an interface between the second doped region 310 and the channel region 320). The lower insulating layer 510 may limit and/or prevent or suppress the channel gate structure 340 from affecting the second doped region 310. A top surface of the lower insulating layer 510 may be in contact with the bottom surface of the channel gate structure 340. The top surface of the lower insulating layer 510 may be located at a level that is higher than those of top surfaces of the center portions 212 and 312 of the first doped region 210 and the second doped region 310. The device isolation layer 400 may include an upper portion that is inserted into a lower portion of the lower insulating layer 510. For example, the lower insulating layer 510 may be formed of or include at least one of oxides (e.g., silicon oxide), nitrides (e.g., silicon nitride), oxynitride (e.g., silicon oxynitride), or combinations thereof.

Contacts 600 may be provided on the first doped region 210, the second doped region 310, the third doped region 230, and the fourth doped region 330, the base contact region 222, and the pad portion 342 of the channel gate structure 340, respectively. The contacts 600 may be electrically and respectively connected to the first doped region 210, the second doped region 310, the third doped region 230, and the fourth doped region 330, the base contact region 222, and the pad portion 342 of the channel gate structure 340. The contacts 600 may include a conductive material. For example, the contacts 600 may be formed of or include at least one of doped semiconductor materials (e.g., doped silicon), metals (e.g., tungsten (W), titanium (Ti), and tantalum (Ta)), conductive metal nitrides (e.g., titanium nitride, tantalum nitride, and tungsten nitride), metal-semiconductor compounds (e.g., metal silicide), or combination thereof.

An upper insulating layer (not shown) may be provided between the contacts 600. The upper insulating layer may be provided to fill gap regions between the contacts 600. The upper insulating layer may limit and/or prevent a short circuit from being formed between electric components which are electrically separated from each other. For example, the upper insulating layer may be formed of or include at least one of oxides (e.g., silicon oxide), nitrides (e.g., silicon nitride), oxynitride (e.g., silicon oxynitride), or combinations thereof.

In some example embodiments, the BJT may be formed in the substrate, and the MOSFET may be formed on the substrate. Thus, the BJT and the MOSFET may be formed through different processes.

In a semiconductor device according to some example embodiments of the inventive concepts, the first semiconductor pattern 200 and the second semiconductor pattern 300 having the BJT and the MOSFET respectively may be provided on the substrate 100. Accordingly, the BJT and the MOSFET may be formed by the same process. This may make it possible to improve process efficiency in a process of fabricating a semiconductor device.

As referred to herein, each given semiconductor pattern of the first semiconductor pattern 200 and the second semiconductor pattern 300 may be referred to as including a lower doped region and an upper doped region in lower and upper portions of the given semiconductor pattern, respectively. For example, in FIG. 1B, the first semiconductor pattern 200 may include a lower doped region that at least partially includes the first doped region 210 and an upper doped region that at least partially includes the third doped region 230. In addition, the second semiconductor pattern 300 may include a lower doped region that at least partially includes the second doped region 310 and an upper doped region that at least partially includes the fourth doped region 330.

FIG. 2A, FIG. 3A, FIG. 4A, and FIG. 5A are plan views illustrating a method of fabricating a semiconductor device according to some example embodiments of the inventive concepts. FIG. 2B, FIG. 3B, FIG. 4B, and FIG. 5B are cross-sectional views, which are respectively taken along lines IIB-IIB' of FIG. 2A, lines IIIB-IIIB' of FIG. 3A, lines IVB-IVB' of FIG. 4A, and lines VB-VB' of FIG. 5A, respectively. FIG. 6 is a cross-sectional view corresponding to the line IB-IB' of FIG. 1A.

Figure 2A:
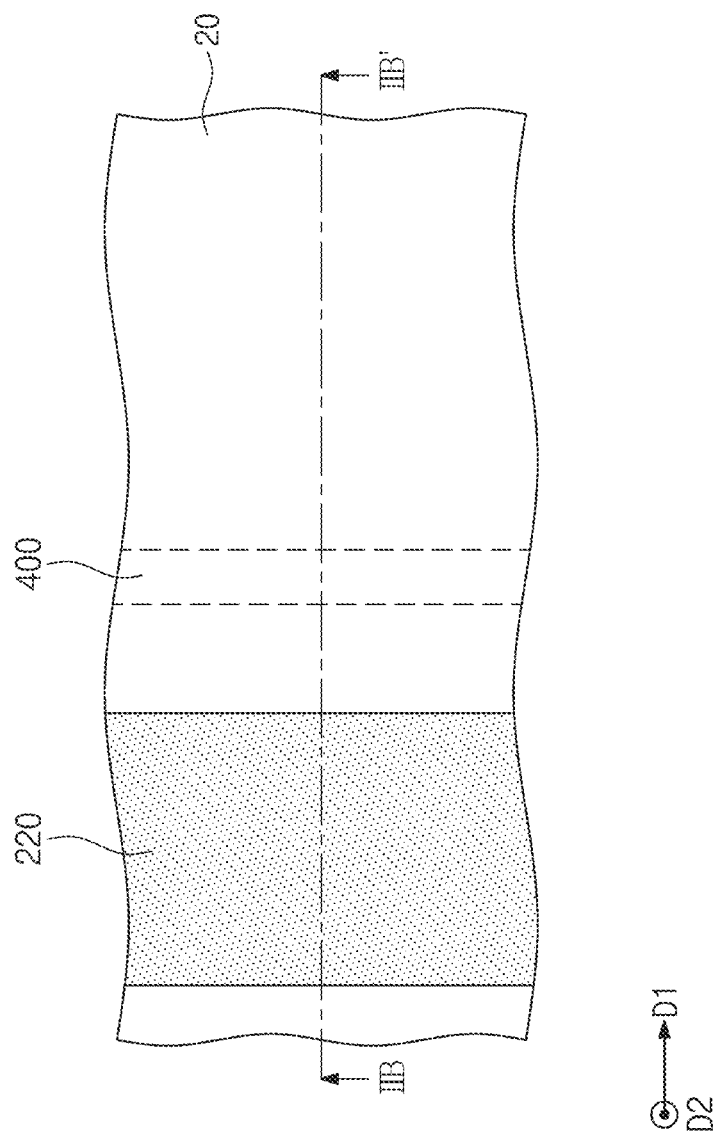
Figure 2B:
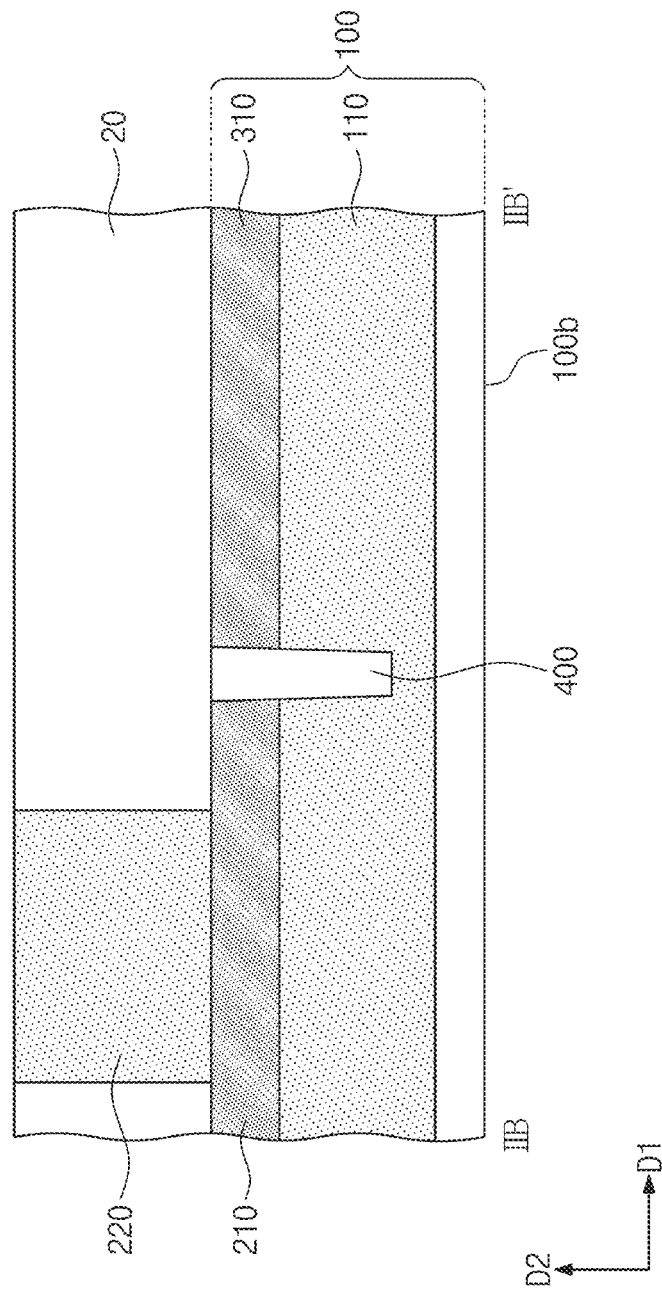

Referring to FIGS. 2A and 2B, the substrate 100 may be prepared. The substrate 100 may be formed of or include a semiconductor material. For example, the substrate 100 may be a silicon wafer, a germanium wafer, a silicon-germanium wafer, a II-VI compound semiconductor wafer, or a III-V compound semiconductor wafer.

The device isolation layer 400 may be formed in the substrate 100. In some example embodiments, the formation of the device isolation layer 400 may include etching a portion of the substrate 100 to form a trench (not shown) and filling the trench with an insulating material. However, the method of forming the device isolation layer 400 is not limited to this example. For example, in some example embodiments, the device isolation layer 400 may be formed by a local-oxidation-of-silicon (LOCOS) process.

The impurity well 110 may be formed in the substrate 100. In some example embodiments, the formation of the impurity well 110 may include injecting impurities of the first conductivity type into the substrate 100. In some example embodiments, the first conductivity type may be an n-type.

The first doped region 210 and the second doped region 310 may be formed in an upper portion of the substrate 100. The formation of the first doped region 210 and the second doped region 310 may include injecting impurities, which have the second conductivity type (e.g., p-type) different from the first conductivity type, into the substrate 100. The first doped region 210 and the second doped region 310 may be formed at the same time (e.g., "concurrently").

A semiconductor layer 20 may be formed on the substrate 100. For example, the semiconductor layer 20 may be formed by an epitaxial process. The semiconductor layer 20 may be an intrinsic semiconductor layer. In other words, the semiconductor layer 20 may not contain impurity. However, the inventive concepts are not limited to this example. In some example embodiments, the semiconductor layer 20 may be doped to have the first conductivity type (e.g., n-type).

The base region 220 may be formed on the first doped region 210. The formation of the base region 220 may include injecting impurities of the first conductivity type (e.g., n-type) into the semiconductor layer 20. Here, a mask (not shown) may be formed on the semiconductor layer 20 to define a region, into which the impurities of the first conductivity type will be injected. The mask may be removed after the injection of impurities of the first conductivity type. Impurities of the first conductivity type may be injected to occupy a region extending from top to bottom of the semiconductor layer 20. Thus, the base region 220 may be formed to pass through the semiconductor layer 20 and to be in contact with the first doped region 210.

Referring to FIGS. 3A and 3B, the third doped region 230 and the fourth doped region 330 may be formed in an upper portion of the semiconductor layer 20. The formation of the third doped region 230 may include injecting impurities of the second conductivity type into the base region 220. The formation of the fourth doped region 330 may include injecting impurities of the second conductivity type into the semiconductor layer 20. Here, a mask (not shown) may be provided on the semiconductor layer 20 to define a region, into the impurities of the second conductivity type will be injected. The mask may be removed after the injection of impurities of the second conductivity type. The third doped region 203 and the fourth doped region 330 may be formed at the same time (e.g., "concurrently"). The third doped region 203 and the fourth doped region 330 may be overlapped with the first doped region 210 and the second doped region 310, respectively, when viewed in a plan view.

The base contact region 222 may be formed on the base region 220. The formation of the base contact region 222 may include injecting impurities of the first conductivity type into the upper portion of the base region 220. Here, a mask (not shown) may be formed on the semiconductor layer 20 to define a region, into which the impurities of the first conductivity type will be injected. The mask may be removed after the injection of the impurities of the first conductivity type. The concentration of the impurities of the first conductivity type may be higher in the base contact region 222 than in the base region 220.

Figure 4A:
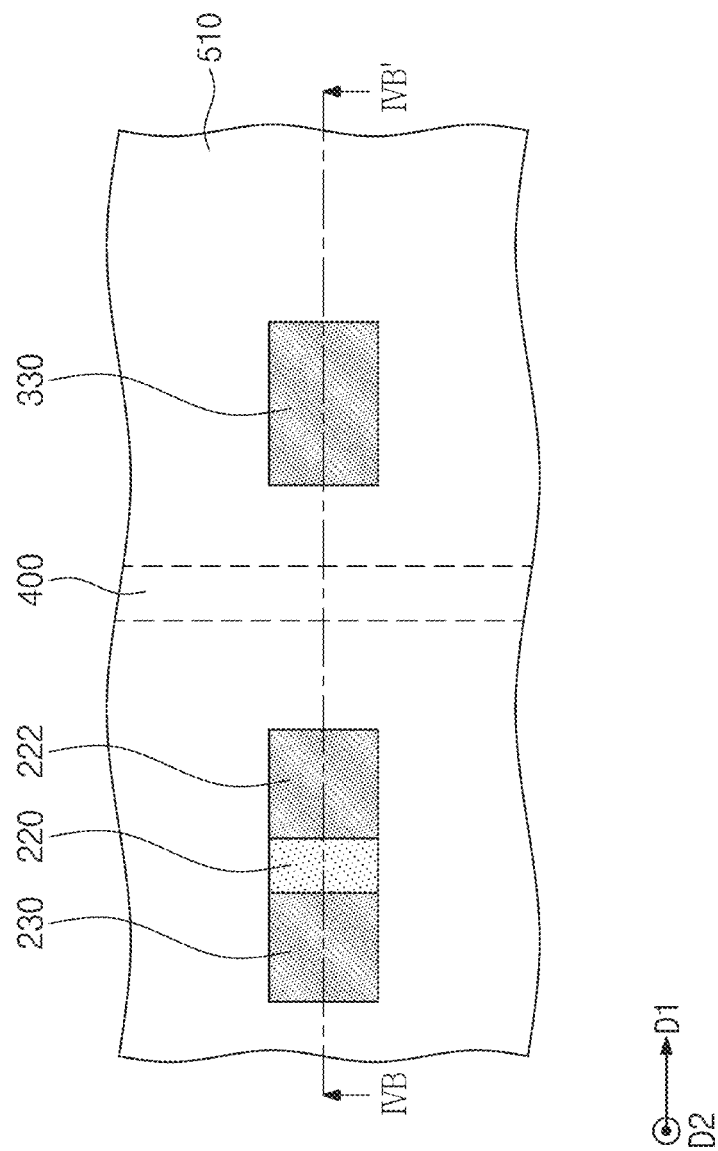
Figure 4B:
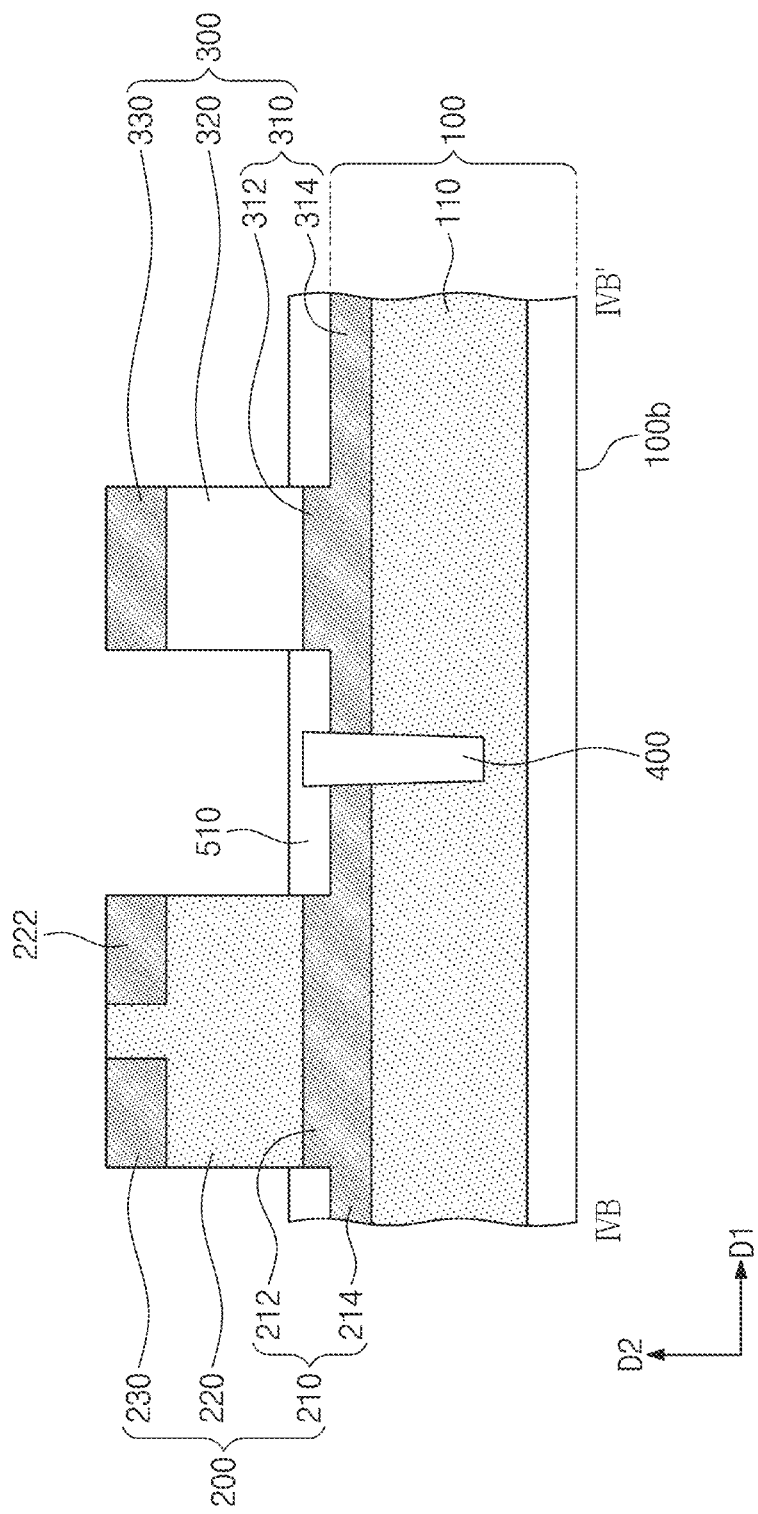

Referring to FIGS. 4A and 4B, the semiconductor layer 20 (e.g., of FIG. 3B) and the substrate 100 may be patterned to expose an upper portion of the device isolation layer 400. In some example embodiments, this patterning process may include anisotropically etching the semiconductor layer 20 using an etch mask (not shown) and may be performed to expose the substrate 100 or the upper portion of the device isolation layer 400.

In addition, as a result of the patterning process, the center portions 212 and 312 and the edge portions 214 and 314 of the first doped region 210 and the second doped region 310 may be defined. The center portions 212 and 312 and the edge portions 214 and 314 of the first doped region 210 and the second doped region 310 may be substantially the same (e.g., may be the same within manufacturing tolerances and/or material tolerances) as those described with reference to FIGS. 1A and 1B.

The first semiconductor pattern 200 and the second semiconductor pattern 300 may be formed through the patterning process. The first semiconductor pattern 200 may include the first doped region 210, the base region 220, and the third doped region 230. The second semiconductor pattern 300 may include the second doped region 310, the channel region 320, and the fourth doped region 330. The first semiconductor pattern 200 and the second semiconductor pattern 300 may be formed to have substantially the same features (e.g., the same features within manufacturing tolerances and/or material tolerances) as those described with reference to FIGS. 1A and 1B.

The lower insulating layer 510 may be formed on the first doped region 210 and the second doped region 310 and the device isolation layer 400. In some example embodiments, the formation of the lower insulating layer 510 may include depositing an insulating layer on the substrate 100 and etching a portion of the insulating layer. The lower insulating layer 510 may be formed to have substantially the same features (e.g., the same features within manufacturing tolerances and/or material tolerances) as those of FIGS. 1A and 1B. For example, the lower insulating layer 510 may be formed of or include at least one of oxides (e.g., silicon oxide), nitrides (e.g., silicon nitride), oxynitride (e.g., silicon oxynitride), or combinations thereof.

Figure 5A:
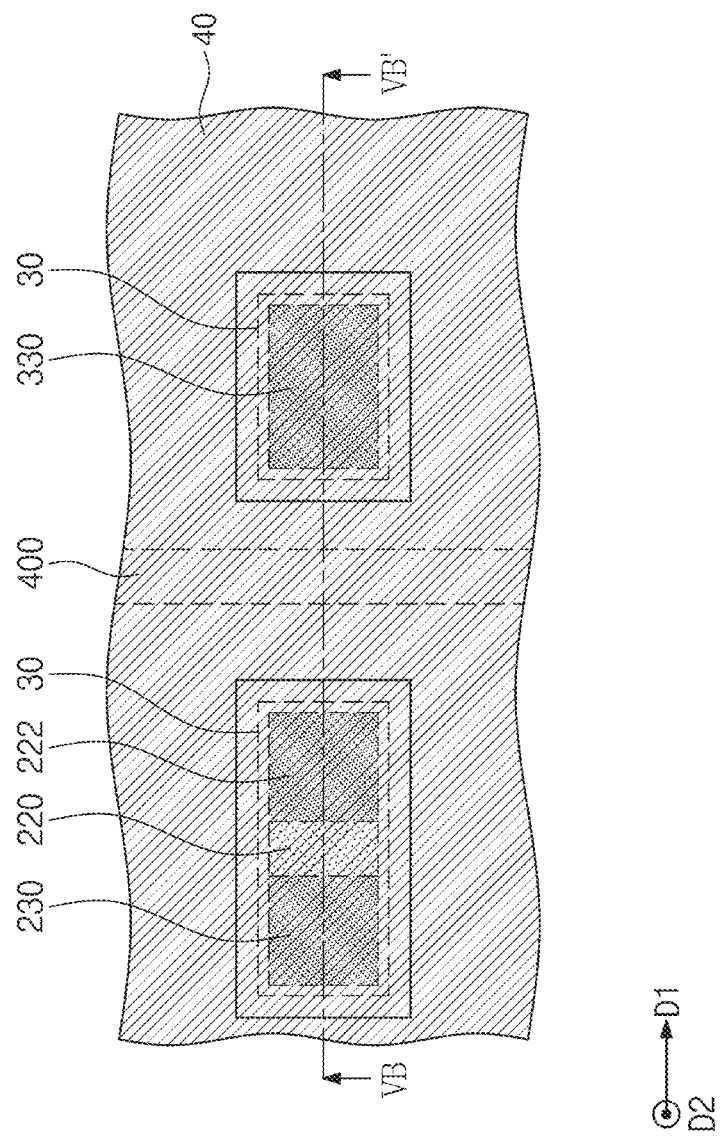
Figure 5B:
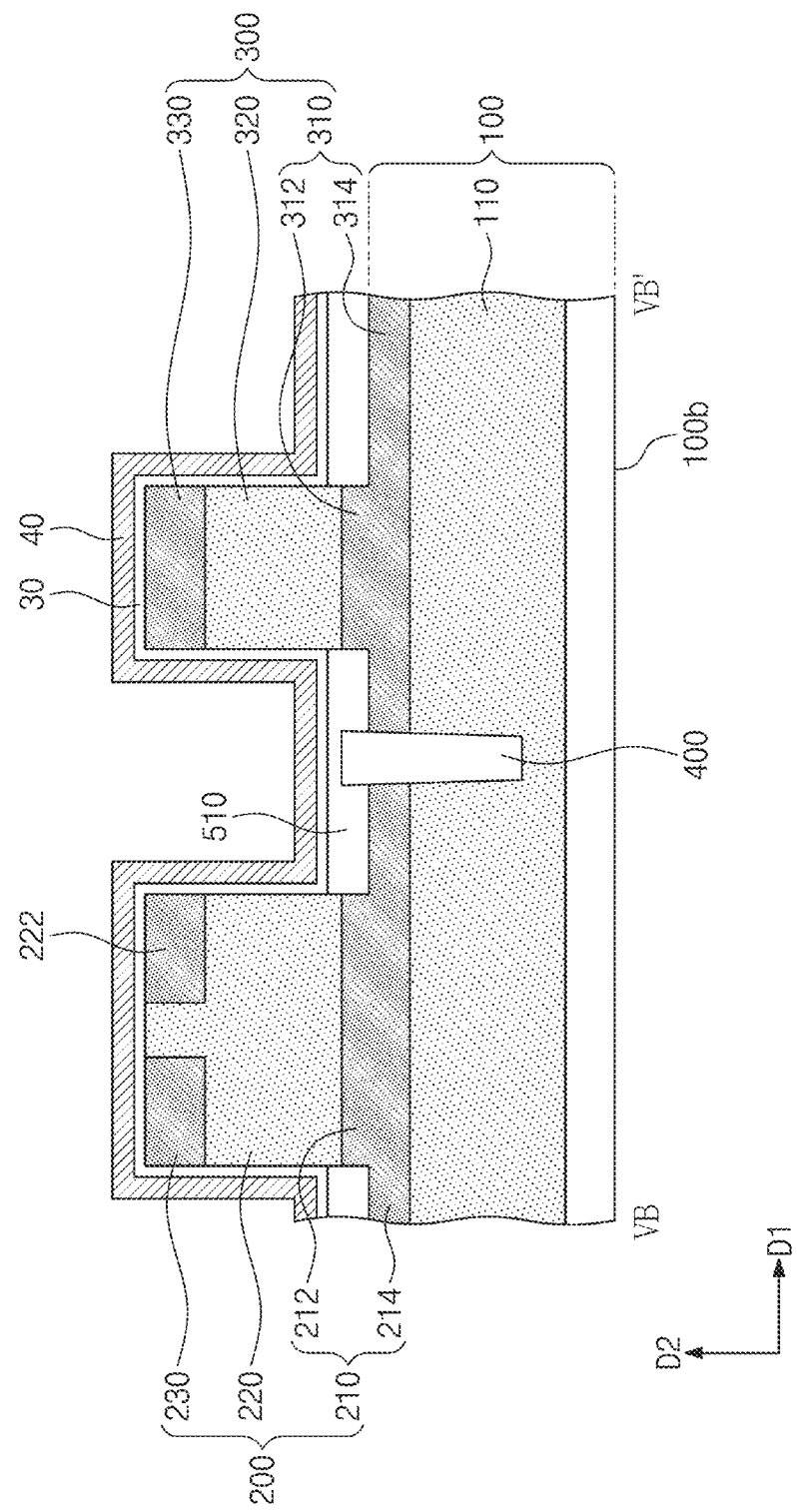
Figure 6:
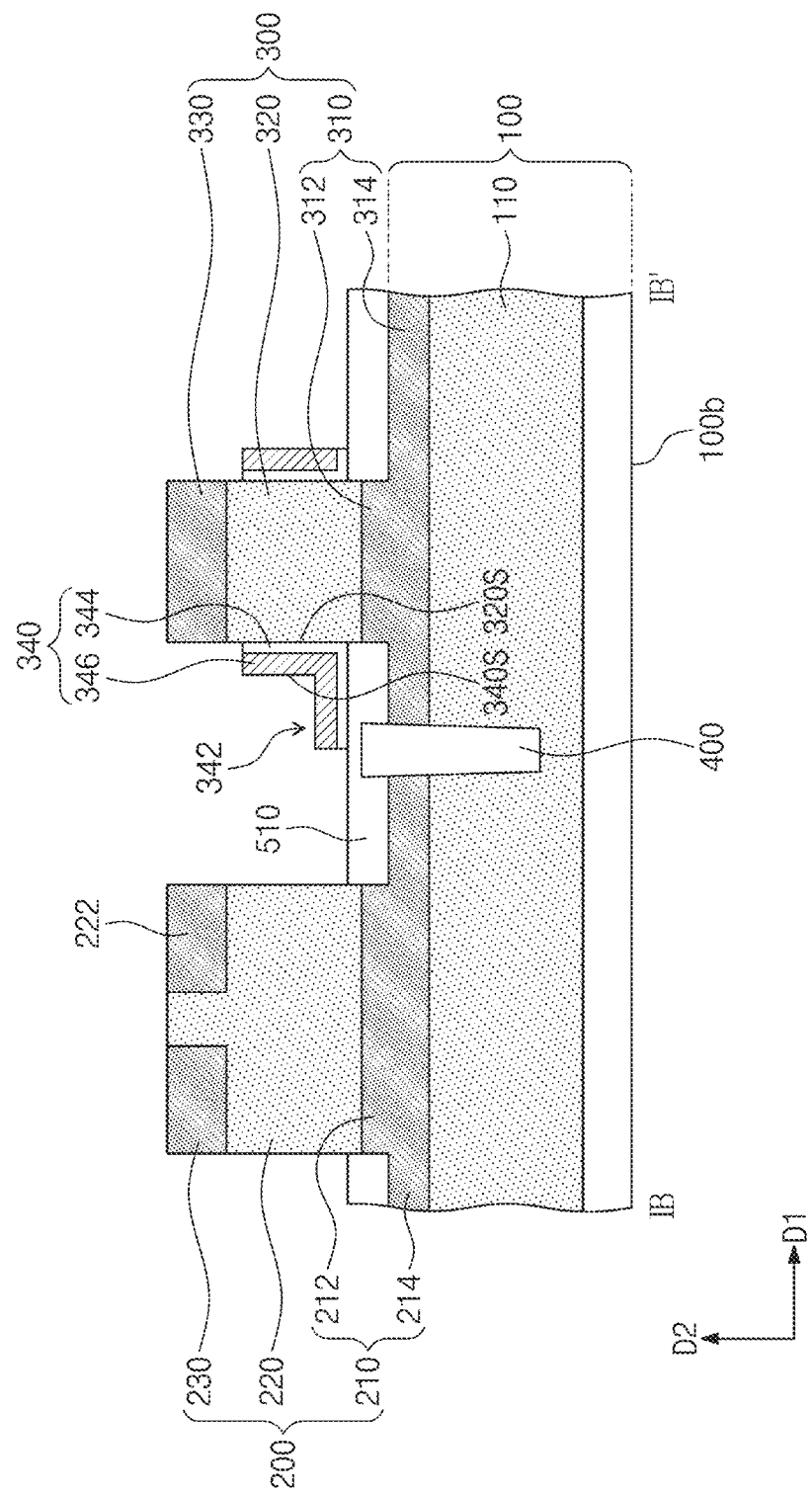
FIG. 6 is a cross-sectional view corresponding to the line IB-IB' of FIG. 1A.

Referring to FIGS. 5A and 5B, a gate insulating layer 30 may be formed on the first semiconductor pattern 200 and the second semiconductor pattern 300 and the lower insulating layer 510. In some example embodiments, the formation of the gate insulating layer 30 may include depositing an insulating material on the first semiconductor pattern 200 and the second semiconductor pattern 300 and the lower insulating layer 510. In some example embodiments, the gate insulating layer 30 may be formed to conformally cover surfaces of the first semiconductor pattern 200 and the second semiconductor pattern 300 and the lower insulating layer 510. The gate insulating layer 30 may include a dielectric material. For example, the gate insulating layer 30 may be formed of or include at least one of high-k dielectric materials (e.g., aluminum oxide (Al2O3), hafnium oxide (HfO2), zirconium oxide (ZrO2), hafnium aluminum oxide (HfAlO), and hafnium silicon oxide (HfSiO)).

A gate conductive layer 40 may be formed on the gate insulating layer 30. In some example embodiments, the formation of the gate conductive layer 40 may include depositing a conductive material on the gate insulating layer 30. For example, the gate conductive layer 40 may be formed to conformally cover a top surface of the gate insulating layer 30. For example, the gate conductive layer 40 may be formed of or include at least one of doped semiconductor materials (e.g., doped silicon), metals (e.g., tungsten (W), titanium (Ti), and tantalum (Ta)), conductive metal nitrides (e.g., titanium nitride, tantalum nitride, and tungsten nitride), metal-semiconductor compounds (e.g., metal silicide), or combination thereof.

Referring to FIGS. 1A and 6 in conjunction with FIG. 5B, the gate conductive layer 40 and the gate insulating layer 30 may be patterned to form the channel gate structure 340 on the side surface of the channel region 320. The patterning of the gate conductive layer 40 and the gate insulating layer 30 may include anisotropically etching the gate conductive layer 40 and the gate insulating layer 30 using an etch mask (not shown). As a result of the patterning of the gate conductive layer 40 and the gate insulating layer 30, the channel gate conductive layer 346 and the channel gate insulating layer 344 may be formed. The channel gate structure 340 may include the channel gate insulating layer 344 and the channel gate conductive layer 346 on the channel gate insulating layer 344. The channel gate structure 340, the channel gate insulating layer 344, and the channel gate conductive layer 346 may be formed to have substantially the same features (e.g., the same features within manufacturing tolerances and/or material tolerances) as those described with reference to FIGS. 1A and 1B. The patterning process may be performed to expose a top surface of the lower insulating layer 510.

Referring back to FIGS. 1A and 1B, an upper insulating layer may be formed on the first semiconductor pattern 200 and the second semiconductor pattern 300 and the lower insulating layer 510. In some example embodiments, the formation of the upper insulating layer may include depositing an insulating material on the first semiconductor pattern 200 and the second semiconductor pattern 300 and the lower insulating layer 510. For example, the upper insulating layer may be formed of or include at least one of oxides, nitrides, oxynitrides, or combinations thereof.

The contacts 600 may be formed in the upper insulating layer. In some example embodiments, the contacts 600 may be electrically connected to the first doped region 210, the second doped region 310, the third doped region 230, and the fourth doped region 330, the base contact region 222, and the channel gate conductive layer 346, respectively. In some example embodiments, the formation of the contacts 600 may include etching the upper insulating layer using an etch mask (not shown) to form contact holes (not shown) and filling the contact holes with a conductive material. For example, the conductive material may be formed of or include at least one of doped semiconductor materials (e.g., doped silicon), metals (e.g., tungsten (W), titanium (Ti), and tantalum (Ta)), conductive metal nitrides (e.g., titanium nitride, tantalum nitride, and tungsten nitride), metal-semiconductor compounds (e.g., metal silicide), or combinations thereof.

In a semiconductor device according to some example embodiments of the inventive concepts, the first semiconductor pattern 200 and the second semiconductor pattern 300 having the BJT and the MOSFET respectively may be provided on the substrate 100 by the same process. Thus, it may be possible to improve process efficiency in a process of fabricating a semiconductor device.

Figure 7:
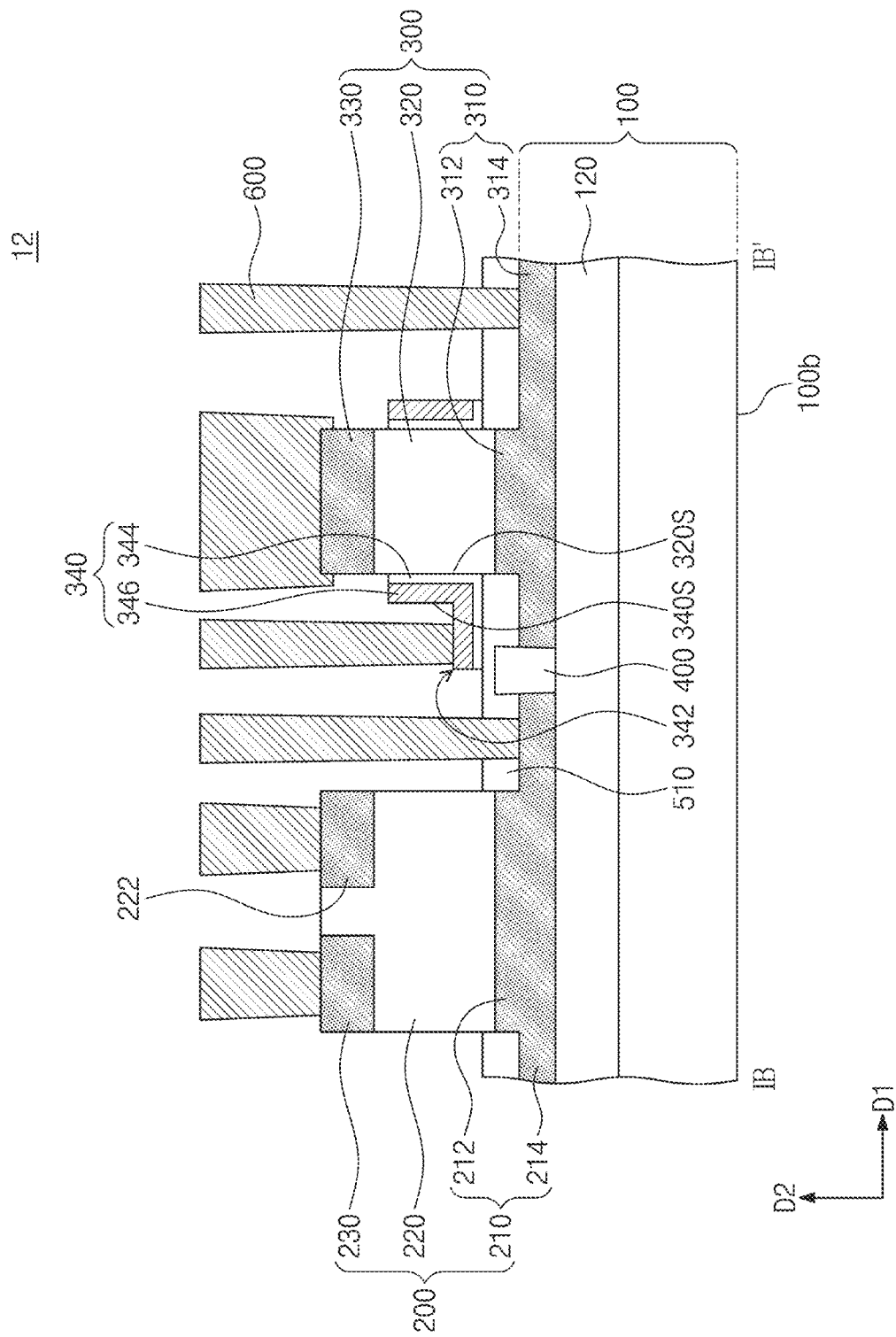
FIG. 7 is a cross-sectional view of a semiconductor device, which is taken along line IB-IB' of FIG. 1A, according to some example embodiments of the inventive concepts.

FIG. 7 is a cross-sectional view of a semiconductor device, which is taken along line IB-IB' of FIG. 1A, according to some example embodiments of the inventive concepts. For concise description, an element previously described with reference to FIGS. 1A and 1B may be identified by a similar or identical reference number without repeating an overlapping description thereof. Except for some features associated with the substrate 100 and the device isolation layer 400, a semiconductor device 12 of FIG. 7 may be substantially the same (e.g., may be the same within manufacturing tolerances and/or material tolerances) as the semiconductor device 10 described with reference to FIGS. 1A and 1B. Thus, the substrate 100 and the device isolation layer 400 will be mainly described below.

Referring to FIGS. 1A and 7, the semiconductor device 12 including the substrate 100 may be provided. Unlike that shown in FIG. 2B, the substrate 100 may be a silicon-on-insulator (SOI) wafer. For example, the substrate 100 may include a buried insulating layer 120, instead of the impurity well 110 of FIG. 1B. The buried insulating layer 120 may be parallel or substantially parallel (e.g., parallel within manufacturing tolerances and/or material tolerances) to the bottom surface 100b of the substrate 100. The buried insulating layer 120 may be formed of or include, for example, oxide. The buried insulating layer 120 may be referred to as a buried oxide (BOX) layer.

The first doped region 210 and the second doped region 310 may be provided on the buried insulating layer 120. The first doped region 210 and the second doped region 310 may be spaced apart from each other in the first direction D1. The first doped region 210 and the second doped region 310 may have bottom surfaces that are in direct contact with a top surface of the buried insulating layer 120. In some example embodiments, when the semiconductor device 12 is operated, there may be a leakage current flowing through bottom surfaces of the first doped region 210 and the second doped region 310. According to some example embodiments of the inventive concepts, the buried insulating layer 120 may contribute to reduce the leakage current through the bottom surfaces of the first doped region 210 and the second doped region 310.

The device isolation layer 400 may be provided between the first doped region 210 and the second doped region 310. The device isolation layer 400 may be used to electrically separate the first doped region 210 and the second doped region 310 from each other. The device isolation layer 400 may be provided on the buried insulating layer 120. Unlike that shown in FIG. 1B, a lower portion of the device isolation layer 400 may be overlapped with the first doped region 210 and the second doped region 310 in a horizontal direction. For example, a bottom surface of the device isolation layer 400 may be coplanar with bottom surfaces of the first doped region 210 and the second doped region 310.

Generally, the BJT and the MOSFET may be respectively formed by different processes. In this case, an impurity injection process may be performed several times, and this may lead to an increase in process cost.

In a semiconductor device according to some example embodiments of the inventive concepts, the first semiconductor pattern 200 and the second semiconductor pattern 300 having the BJT and the MOSFET respectively may be provided on the substrate 100 through the same process. Thus, it may be possible to reduce the number of the impurity injection processes to be performed and consequently to realize reduced process cost and improved process efficiency.

Hereinafter, a method of fabricating a semiconductor device 12 will be described with reference to FIG. 7. For concise description, an element previously described with reference to FIGS. 2A to 6 may be identified by a similar or identical reference number without repeating an overlapping description thereof. Except for steps of forming the substrate 100, and the device isolation layer 400, the first doped region 210, and the second doped region 310, the method of FIG. 7 may be substantially the same (e.g., may be the same within manufacturing tolerances and/or material tolerances) as the method for fabricating the semiconductor device 10, described with reference to FIGS. 2A to 6.

The substrate 100 may be prepared. Unlike that shown in FIG. 2B, the substrate 100 may be or include a silicon-on-insulator (SOI) wafer. The substrate 100 may include the buried insulating layer 120 provided therein. The substrate 100 may include upper and lower semiconductor layers (not shown) that are spaced apart from each other with the buried insulating layer 120 interposed therebetween. For example, the upper and lower semiconductor layers may be respectively provided on top and bottom surfaces of the buried insulating layer 120. The device isolation layer 400 may be formed in the upper semiconductor layer on the buried insulating layer 120. The formation of the device isolation layer 400 may include etching the upper semiconductor layer on the buried insulating layer 120 to form a trench (not shown) and filling the trench with an insulating material.

The first doped region 210 and the second doped region 310 may be formed on the buried insulating layer 120. The formation of the first doped region 210 and the second doped region 310 may include impurities of second conductivity type (e.g., p-type) into the upper semiconductor layer.

Thereafter, in order to fabricate the semiconductor device 12 of FIG. 7, the process steps described with reference to FIGS. 2A to 6 (i.e., to fabricate the semiconductor device 10) may be performed on the resulting structure with the first doped region 210 and the second doped region 310.

In a semiconductor device according to some example embodiments of the inventive concepts, the first semiconductor pattern 200 and the second semiconductor pattern 300 having the BJT and the MOSFET respectively may be provided on the substrate 100 by the same process. Thus, it may be possible to improve process efficiency in a process of fabricating a semiconductor device.

Figure 8B:
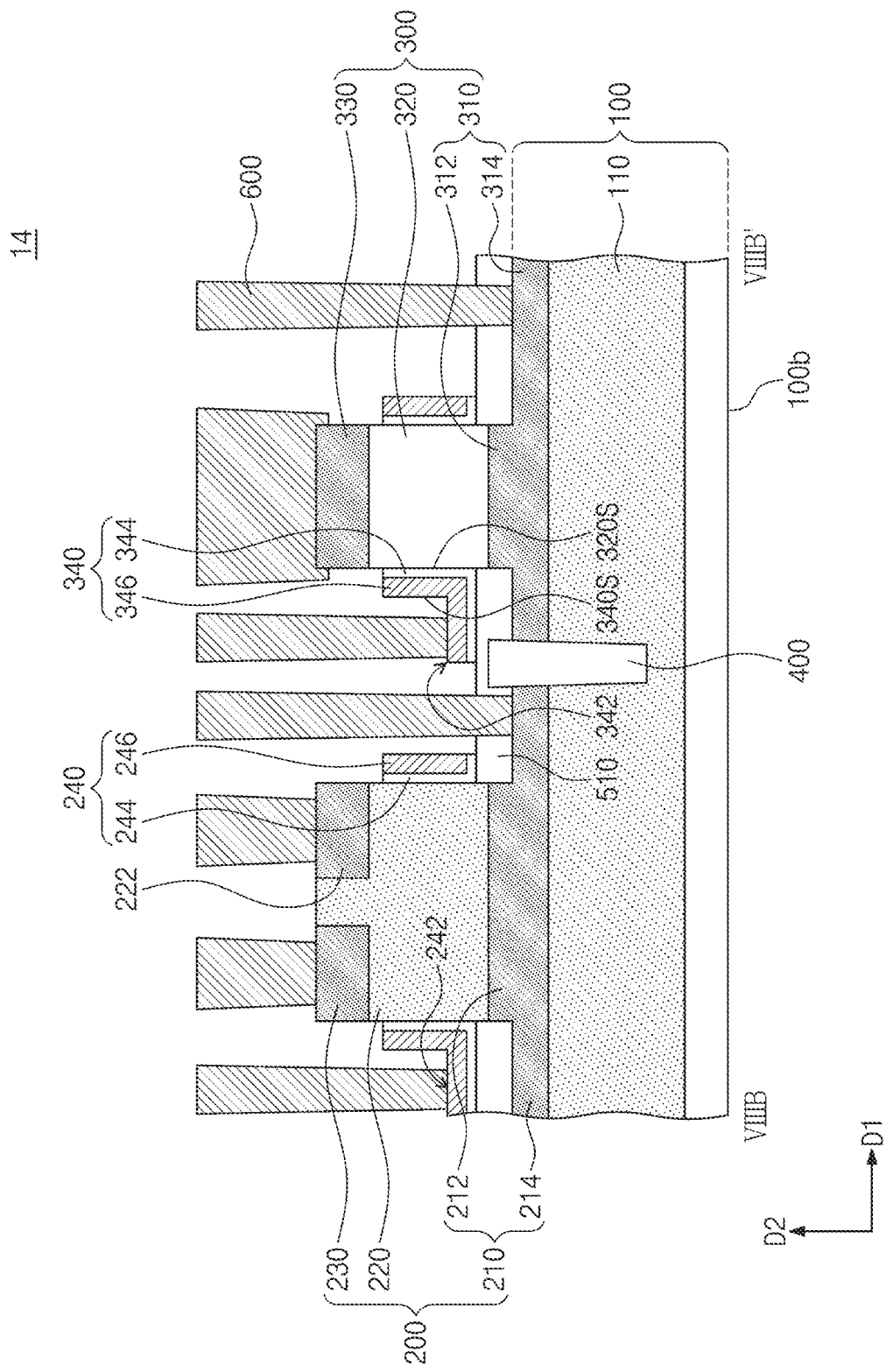
FIG. 8B is a cross-sectional view taken along line VIIIB-VIIIB' of FIG. 8A.

FIG. 8A is a plan view of a semiconductor device according to some example embodiments of the inventive concepts. FIG. 8B is a cross-sectional view taken along line VIIIB-VIIIB' of FIG. 8A. For concise description, an element previously described with reference to FIGS. 1A and 1B may be identified by a similar or identical reference number without repeating an overlapping description thereof. A base gate structure 240 may be provided on the side surface of the base region 220, and the contact 600 may be provided on the base gate structure 240. Except for some features associated with the base gate structure 240 and the contact 600, a semiconductor device 14 of FIGS. 8A and 8B may be substantially the same (e.g., may be the same within manufacturing tolerances and/or material tolerances) as the semiconductor device 10 described with reference to FIGS. 1A and 1B. Hereinafter, the base gate structure 240 and the contacts 600 will be described in more detail.

Referring to FIGS. 8A and 8B, the base gate structure 240 may be provided on a side surface 220s of the base region 220. The base gate structure 240 may extend along the side surface 220s of the base region 220 and may enclose the side surface 220s of the base region 220. The base gate structure 240 may be a ring-shaped structure extending along the side surface 220s of the base region 220. The base gate structure 240 may be overlapped with the base region 220 in a horizontal direction. The base gate structure 240 may have a thickness that is measured in the second direction D2. The largest thickness of the base gate structure 240 may be smaller than a thickness of the base region 220. The base gate structure 240 may be spaced apart from the first doped region 210 and the third doped region 230. For example, the base gate structure 240 may be spaced apart from the first doped region 210 and the third doped region 230 in the second direction D2. The base gate structure 240 may not be overlapped with the first doped region 210 and the third doped region 230 in a horizontal direction. When viewed in a vertical section, the base gate structure 240 may be located between the top surface of the first doped region 210 and the bottom surface of the third doped region 230. A bottom surface of the base gate structure 240 may be located at a level higher than that of the top surface of the first doped region 210. A top surface of the base gate structure 240 may be located at a level lower than that of the bottom surface of the third doped region 230. The base gate structure 240 may have a pad portion 242 protruding from a side surface 240s of the base gate structure 240. The pad portion 242 may be used for electrical connection with the contact 600 to be described below. The base gate structure 240 may be used as a control gate for controlling an amount of electric current flowing through a base region of the BJT.

The base gate structure 240 may include a base gate insulating layer 244 and a base gate conductive layer 246, which is provided on the base gate insulating layer 244. The base gate insulating layer 244 may be provided between the base gate conductive layer 246 and the base region 220. The base gate conductive layer 246 may be electrically disconnected from the base region 220 by the base gate insulating layer 244. The base gate insulating layer 244 may be formed of or include a dielectric material. For example, the base gate insulating layer 244 may be formed of or include at least one of high-k dielectric materials (e.g., aluminum oxide ($Al_2O_3$), hafnium oxide ($HfO_2$), zirconium oxide ($ZrO_2$), hafnium aluminum oxide (HfAlO), and hafnium silicon oxide (HfSiO)). The base gate conductive layer 246 may include a conductive material. For example, the base gate conductive layer 246 may be formed of or include at least one of doped semiconductor materials (e.g., doped silicon), metals (e.g., tungsten (W), titanium (Ti), and tantalum (Ta)), conductive metal nitrides (e.g., titanium nitride, tantalum nitride, and tungsten nitride), metal-semiconductor compounds (e.g., metal silicide), or combination thereof.

The contact 600 may be provided on the pad portion 242 of the base gate structure 240. The contact 600 may be electrically connected to the base gate conductive layer 246. The contact 600 may be formed of or include a conductive material. For example, the contact 600 may be formed of or include at least one of doped semiconductor materials (e.g., doped silicon), metals (e.g., tungsten (W), titanium (Ti), and tantalum (Ta)), conductive metal nitrides (e.g., titanium nitride, tantalum nitride, and tungsten nitride), metal-semiconductor compounds (e.g., metal silicide), or combination thereof.

Hereinafter, a method of fabricating a semiconductor device 14 will be described with reference to FIGS. 8A and 8B. For concise description, an element previously described with reference to FIGS. 2A to 6 may be identified by a similar or identical reference number without repeating an overlapping description thereof. Except for a step of forming the base gate structure 240, the method of FIGS. 8A and 8B may be substantially the same (e.g., may be the same within manufacturing tolerances and/or material tolerances) as the method for fabricating the semiconductor device 10, described with reference to FIGS. 2A to 6.

Referring back to FIG. 6, the gate insulating layer 30 and the gate conductive layer 40 may be patterned. However, unlike that shown in FIG. 6, the gate insulating layer 30 and the gate conductive layer 40 may not be removed from the side surface of each of the base region 220 and the channel region 320. Accordingly, the base gate structure 240 may be formed on a side surface of the base region 220, and the channel gate structure 340 may be formed on a side surface of the channel region 320. The base gate structure 240 may include the base gate insulating layer 244 and the base gate conductive layer 246 on the base gate insulating layer 244. The channel gate structure 340 may include the channel gate insulating layer 344 and the channel gate conductive layer 346 on the channel gate insulating layer 344.

In a semiconductor device according to some example embodiments of the inventive concepts, the first semiconductor pattern 200 and the second semiconductor pattern 300 having the BJT and the MOSFET respectively may be provided on the substrate 100 through the same process. Thus, it may be possible to improve process efficiency in a process of fabricating a semiconductor device.

Figure 9:
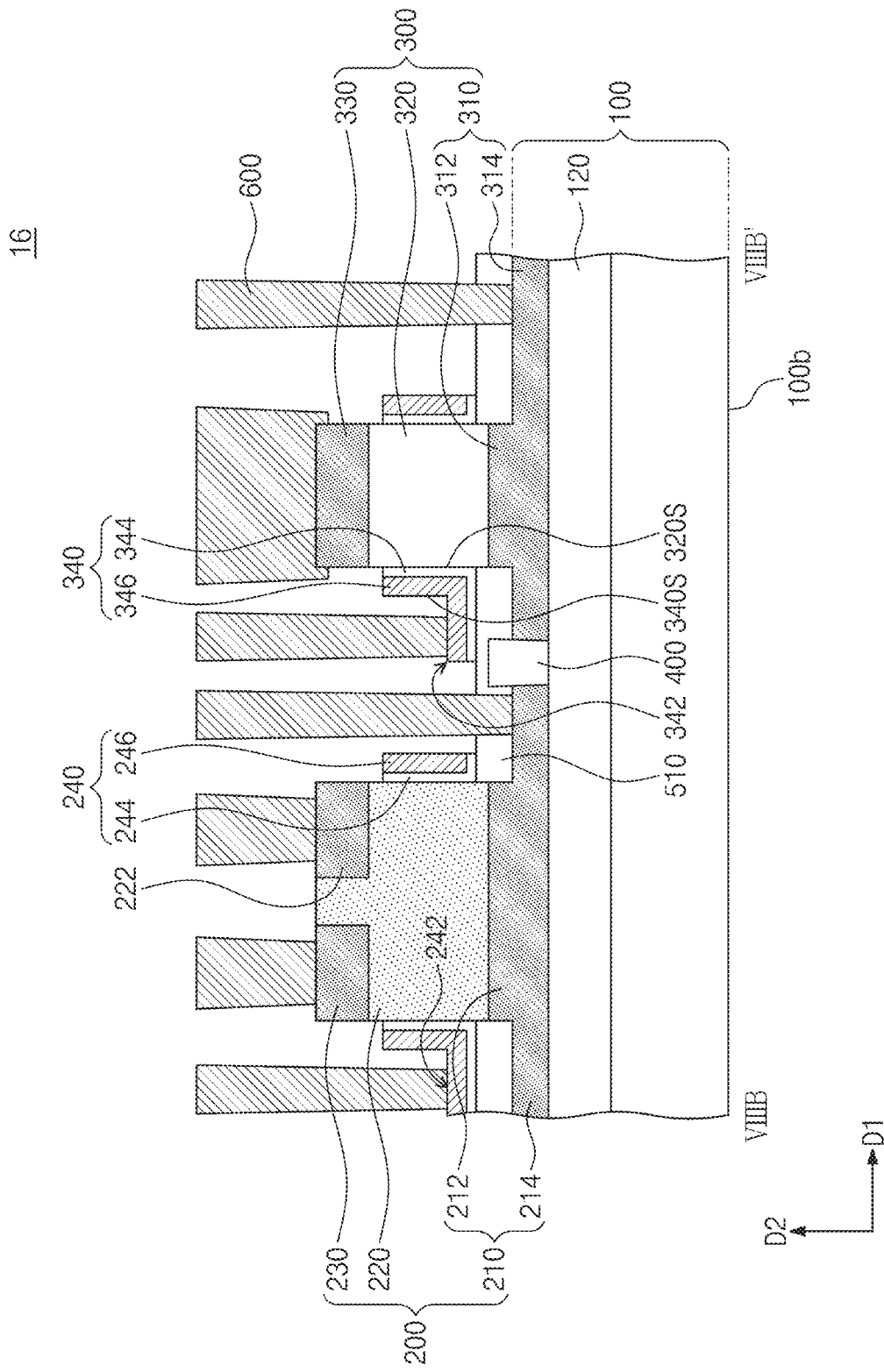
FIG. 9 is a cross-sectional view of a semiconductor device, which is taken along line VIIIB-VIIIB' of FIG. 8A, according to some example embodiments of the inventive concepts.

FIG. 9 is a cross-sectional view of a semiconductor device, which is taken along line VIIIB-VIIIB' of FIG. 8A, according to some example embodiments of the inventive concepts. For concise description, an element previously described with reference to FIGS. 8A and 8B may be identified by a similar or identical reference number without repeating an overlapping description thereof. Except for some features associated with the substrate 100 and the device isolation layer 400, a semiconductor device 16 of FIG. 9 may be substantially the same (e.g., may be the same within manufacturing tolerances and/or material tolerances) as the semiconductor device 14 described with reference to FIGS. 8A and 8B. Thus, the substrate 100 and the device isolation layer 400 will be mainly described below.

Referring to FIGS. 8A and 9, the semiconductor device 16 including the substrate 100 may be provided. The substrate 100 may be a silicon-on-insulator (SOI) wafer. For example, the substrate 100 may include the buried insulating layer 120, instead of the impurity well 110 of FIG. 1B. The buried insulating layer 120 may be parallel or substantially parallel (e.g., parallel within manufacturing tolerances and/or material tolerances) to the bottom surface 100b of the substrate 100. The buried insulating layer 120 may be formed of or include, for example, oxide. The buried insulating layer 120 may be referred to as a buried oxide (BOX) layer.

The first doped region 210 and the second doped region 310 may be provided on the buried insulating layer 120. The first doped region 210 and the second doped region 310 may be spaced apart from each other in the first direction D1. The first doped region 210 and the second doped region 310 may have bottom surfaces that are in direct contact with a top surface of the buried insulating layer 120. In some example embodiments, when the semiconductor device 12 is operated, there may be a leakage current flowing through bottom surfaces of the first doped region 210 and the second doped region 310. According to some example embodiments of the inventive concepts, the buried insulating layer 120 may contribute to reduce the leakage current through the bottom surfaces of the first doped region 210 and the second doped region 310.

The device isolation layer 400 may be provided between the first doped region 210 and the second doped region 310. The device isolation layer 400 may be used to electrically separate the first doped region 210 and the second doped region 310 from each other. The device isolation layer 400 may be provided on the buried insulating layer 120. Unlike that shown in FIG. 8B, a lower portion of the device isolation layer 400 may be overlapped with the first doped region 210 and the second doped region 310 in a horizontal direction. For example, a bottom surface of the device isolation layer 400 may be coplanar with bottom surfaces of the first doped region 210 and the second doped region 310.

In a semiconductor device according to some example embodiments of the inventive concepts, the first semiconductor pattern 200 and the second semiconductor pattern 300 having the BJT and the MOSFET respectively may be provided on the substrate 100 through the same process. Thus, it may be possible to reduce process cost and improve process efficiency in a process of fabricating a semiconductor device.

In some example embodiments, the BJT may be formed in the substrate, and the MOSFET may be formed on the substrate. Thus, the BJT and the MOSFET should be respectively formed through different processes. By contrast, in a semiconductor device according to some example embodiments of the inventive concepts, the first semiconductor pattern 200 and the second semiconductor pattern 300 having the BJT and the MOSFET respectively may be provided on the substrate 100. Accordingly, the BJT and the MOSFET may be formed by the same process. This may make it possible to improve process efficiency in a process of fabricating a semiconductor device.

However, technical effects of the inventive concepts are not limited thereto.

While example embodiments of the inventive concepts have been particularly shown and described, it will be understood by one of ordinary skill in the art that variations in form and detail may be made therein without departing from the spirit and scope of the attached claims.

What is claimed is:

1. A method of fabricating a semiconductor device, comprising:
    providing a substrate, the substrate including a device isolation layer;
    forming a first semiconductor pattern and a second semiconductor pattern on the substrate; and
    forming a channel gate structure on a side surface of the second semiconductor pattern,
    wherein the first semiconductor pattern and the second semiconductor pattern are isolated from direct contact with each other in a first direction that is substantially parallel to a top surface of the substrate,
    wherein the device isolation layer is between the first semiconductor pattern and the second semiconductor pattern in the first direction,
    wherein each given semiconductor pattern, of the first semiconductor pattern and the second semiconductor pattern, includes a lower doped region and an upper doped region in lower and upper portions of the given semiconductor pattern, respectively,
    wherein the first semiconductor pattern includes a base region between the upper doped region and the lower doped region of the first semiconductor pattern, and a base contact region that is isolated from direct contact with the upper doped region of the first semiconductor pattern in the first direction,
    wherein the base region and the base contact region are associated with a first conductivity type, and
    wherein the upper doped region and the lower doped region of each given semiconductor pattern are associated with a second conductivity type that is different from the first conductivity type.

2. The method of claim 1, wherein the forming of the first and second semiconductor patterns comprises:
    forming a first doped region and a second doped region in an upper portion of the substrate, the first doped region and the second doped region being isolated from direct contact with each other in the first direction;
    forming a semiconductor layer on the substrate, such that the semiconductor layer covers the first doped region and the second doped region;
    forming a third doped region and a fourth doped region in an upper portion of the semiconductor layer to be vertically overlapped with the first doped region and the second doped region, respectively; and
    patterning the semiconductor layer and an upper portion of the first doped region, using an etch mask.

3. The method of claim 2, wherein the forming of the first doped region and the second doped region comprises injecting impurities of the second conductivity type into the upper portion of the semiconductor layer, and the first doped region and the second doped region are formed at the same time.

4. The method of claim 2, wherein the providing the substrate comprises:
    forming an impurity well including a first set of impurities on a lower portion of the substrate;
    wherein the first doped region of the substrate and the second doped region of the substrate including a second set of impurities different from the first set of impurities.

5. The method of claim 1, wherein the forming the channel gate structure on the side surface of the second semiconductor pattern comprises:
    forming a gate conductive layer on the first semiconductor pattern and the second semiconductor pattern; and
    patterning the gate conductive layer to form a channel gate conductive layer on the side surface of the second semiconductor pattern and to eliminate the gate conductive layer on the first semiconductor pattern.

6. The method of claim 1, wherein the forming of the channel gate structure on the side surface of the second semiconductor pattern comprises:
    forming a gate conductive layer to cover the first and second semiconductor patterns; and
    patterning the gate conductive layer to form a channel gate conductive layer on the side surface of the second semiconductor pattern and a base gate structure on a side surface of the base region,
    wherein the base gate structure and the channel gate structure are formed at the same time.

7. The method of claim 1, further comprising:
    injecting impurities of the first conductivity type into an upper portion of the first semiconductor pattern to form the base contact region.

8. A method of fabricating a semiconductor device, comprising:
    forming a device isolation layer in a substrate;
    forming an impurity well in the substrate by injecting a first conductivity type into the substrate;
    forming a first doped region and a second doped region in an upper portion of the substrate by injecting a second conductivity type;
    forming a semiconductor layer on the substrate;
    forming a base region on the first doped region by injecting impurities of the first conductivity type;
    forming a third doped region and a fourth doped region in upper portion of the semiconductor layer by injecting impurities of the second conductivity type;
    forming a base contact region by injecting impurities of the first conductivity type in to upper portion of the base region;
    patterning the semiconductor and the substrate to expose an upper portion of the device isolation layer, wherein patterning semiconductor and the substrate includes forming a first semiconductor pattern and a second semiconductor pattern;
    forming a lower insulating layer on the first doped region, the second doped region, and the device isolation layer;
    forming a gate insulating layer on the first semiconductor pattern, the second semiconductor pattern and the lower insulating layer;
    forming a gate conductive layer on the gate insulating layer by depositing a conductive layer;
    patterning the gate conductive layer and the gate insulating layer to form a channel gate structure on a side surface of a channel region;
    forming an upper insulating layer on the first semiconductor pattern, the second semiconductor pattern and the lower insulating layer; and
    forming contacts in the upper insulating layer.

9. The method of claim 8, wherein the forming the base region comprises:

injecting the impurities of the first conductivity type to occupy a region in contact with the first doped region extending from top to bottom of the semiconductor layer.

10. The method of claim 8,
wherein a concentration of the impurities of the first conductivity type is higher in the base contact region than in the base region.

11. The method of claim 8,
wherein a thickness of the base region, in a second direction that is substantially perpendicular to a top surface of the substrate, is equal to or larger than a thickness of the channel region.

12. The method of claim 11,
wherein a width of the fourth doped region is equal to a width of the channel region, in the second doped region.

13. A method of fabricating a semiconductor device, comprising:
providing a substrate, the substrate including a device isolation layer;
forming a first doped region and a second doped region at the same time, wherein the first doped region and the second doped region isolated from direct contact with each other in a first direction such that the device isolation layer is between the first doped region and the second doped region in the first direction;
forming a first semiconductor pattern and a second semiconductor pattern on the a first doped region and the second doped region respectively; and
forming a gate structure on a side surface of the second semiconductor pattern and not forming the gate structure on the first semiconductor pattern,
wherein the first semiconductor pattern includes a base region on the first doped region, and a third doped region on the base region,
wherein the second semiconductor pattern includes a channel region on the second doped region, and a fourth doped region on the channel region.

14. The method of claim 13, further comprising:
forming a base contact region on the base region,
wherein the base contact region is isolated from direct contact with the third doped region in the first direction, and the base region and the base contact region are associated with a first conductivity type.

15. The method of claim 13,
wherein each doped region, of the first doped region and the second doped region, includes an edge portion and a center portion, the edge portion of the first doped region extending in the first direction beyond a side surface of the base region and beyond a side surface of the third doped region such that the edge portion of the first doped region is exposed by both the base region and the third doped region, the edge portion of the second doped region extending in the first direction beyond a side surface of the channel region and beyond a side surface of the fourth doped region such that the edge portion of the second doped region is exposed by both the channel region and the fourth doped region, the center portion protruding from the edge portion in a second direction.

* * * * *